(12) United States Patent
Chou

(10) Patent No.: US 12,730,152 B2
(45) Date of Patent: Sep. 8, 2026

(54) TEST CONTROL DEVICE AND OPERATING METHOD THEREOF

(71) Applicant: Lite-On Technology Corporation, Taipei (TW)

(72) Inventor: Jin-Jye Chou, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 176 days.

(21) Appl. No.: 18/613,137

(22) Filed: Mar. 22, 2024

(65) Prior Publication Data

US 2025/0271502 A1 Aug. 28, 2025

(30) Foreign Application Priority Data

Feb. 23, 2024 (TW) ................................ 113106541

(51) Int. Cl.
*G01R 31/02* (2006.01)
*G01R 31/319* (2006.01)

(52) U.S. Cl.
CPC . *G01R 31/31908* (2013.01); *G01R 31/31905* (2013.01); *G01R 31/31907* (2013.01); *G01R 31/31924* (2013.01)

(58) Field of Classification Search
CPC ........ G01R 31/31905; G01R 31/31907; G01R 31/31908; G01R 31/31924
See application file for complete search history.

(56) References Cited

U.S. PATENT DOCUMENTS

| | | | | |
|---|---|---|---|---|
| 9,323,707 | B2 * | 4/2016 | Chen | G06F 13/4027 |
| 2006/0282736 | A1 * | 12/2006 | Schroth | G01R 31/31908 714/742 |
| 2009/0326905 | A1 * | 12/2009 | Cao | G01R 31/40 323/318 |
| 2012/0293195 | A1 * | 11/2012 | Bourstein | G01R 31/31721 324/750.01 |
| 2015/0123696 | A1 * | 5/2015 | Bhogela | G01R 31/2894 324/762.02 |
| 2018/0196110 | A1 * | 7/2018 | Chen | G01R 31/40 |

FOREIGN PATENT DOCUMENTS

| | | |
|---|---|---|
| TW | 202221521 | 6/2022 |

OTHER PUBLICATIONS

"Office Action of Taiwan Counterpart Application", issued on Oct. 11, 2024, p. 1-p. 8.

* cited by examiner

*Primary Examiner* — Thang X Le
(74) *Attorney, Agent, or Firm* — JCIPRNET

(57) ABSTRACT

A test control device and an operating method thereof are disclosed. The test control device includes a voltage generator and a data processor. The voltage generator is coupled to a device under test which is a universal serial bus interface through a first connector. The voltage generator is configured to generate a supply voltage to the device under test. The data processor receives a test signal sent by an external electronic device through a second connector. The data processor forwards the test signal to the device under test through the first connector. The processor receives a test feedback data from the device under test through the first connector.

16 Claims, 6 Drawing Sheets

TEST CONTROL DEVICE AND OPERATING METHOD THEREOF

CROSS-REFERENCE TO RELATED APPLICATION

This application claims the priority benefit of Taiwan application serial no. 113106541, filed on Feb. 23, 2024. The entirety of the above-mentioned patent application is hereby incorporated by reference herein and made a part of this specification.

BACKGROUND

Technical Field

This disclosure relates to an electronic device, and in particular to a test control device and an operating method thereof.

Description of Related Art

In the existing debugging techniques, when wanting to debug or manage the function of a device under test (e.g., a USB device), the user usually utilizes a desktop computer or a laptop computer and connects to the device under test through a cable to manage and debug the working status of the device under test.

However, there is a commonality problem between the transmission interface of the device under test and the transmission interface of the computer operated by the user, which causes the user to spend extra time to confirm the debugging environment. In addition, the user needs to prepare additional cables to enable a wired connection between the device under test and the computer operated by the user. In this case, familiar debugging techniques are time-consuming and inconvenient, which in turn affects the quality of debugging and management of the device under test.

In view of this, how to effectively enhance the convenience of debugging and management of devices under test, in order to improve the quality of operation, will be the subject of the relevant technical personnel in this field.

SUMMARY

The disclosure provides a test control device and an operating method thereof, capable of supplying power to a device under test through a cable, and enabling an external electronic device to debug or manage and operate working status of the device under test in a wired or wireless data transmission mode.

The test control device of the disclosure includes a voltage generator and a data processor. The voltage generator is coupled to the device under test as a universal serial bus interface through a first connector. The voltage generator is configured to generate a supply voltage to the device under test. The data processor is coupled to the first connector and a second connector. The data processor receives a test signal sent by an external electronic device through the second connector. The data processor forwards the test signal to the device under test through the first connector. The data processor receives a test feedback data from the device under test through the first connector.

The operating method of the test control device of the disclosure includes the following. A voltage generator is enabled to be coupled to a device under test as a universal serial bus interface through a first connector, and the voltage generator is enabled to generate a supply voltage to the device under test. A data processor is enabled to receive a test signal sent by an external electronic device through a second connector. The data processor is enabled to forward the test signal to the device under test through the first connector. The data processor is enabled to receive a test feedback data from the device under test through the first connector.

Based on the above, in addition to supplying power to the device under test through the cable, the test control device and the operating method thereof described in embodiments of the disclosure may also be connected to the external electronic device through wireless or wired connections, so that the external electronic device is able to debug or manage functions and working status of the device under test through the test control device, so as to enhance convenience and improve operation quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1:
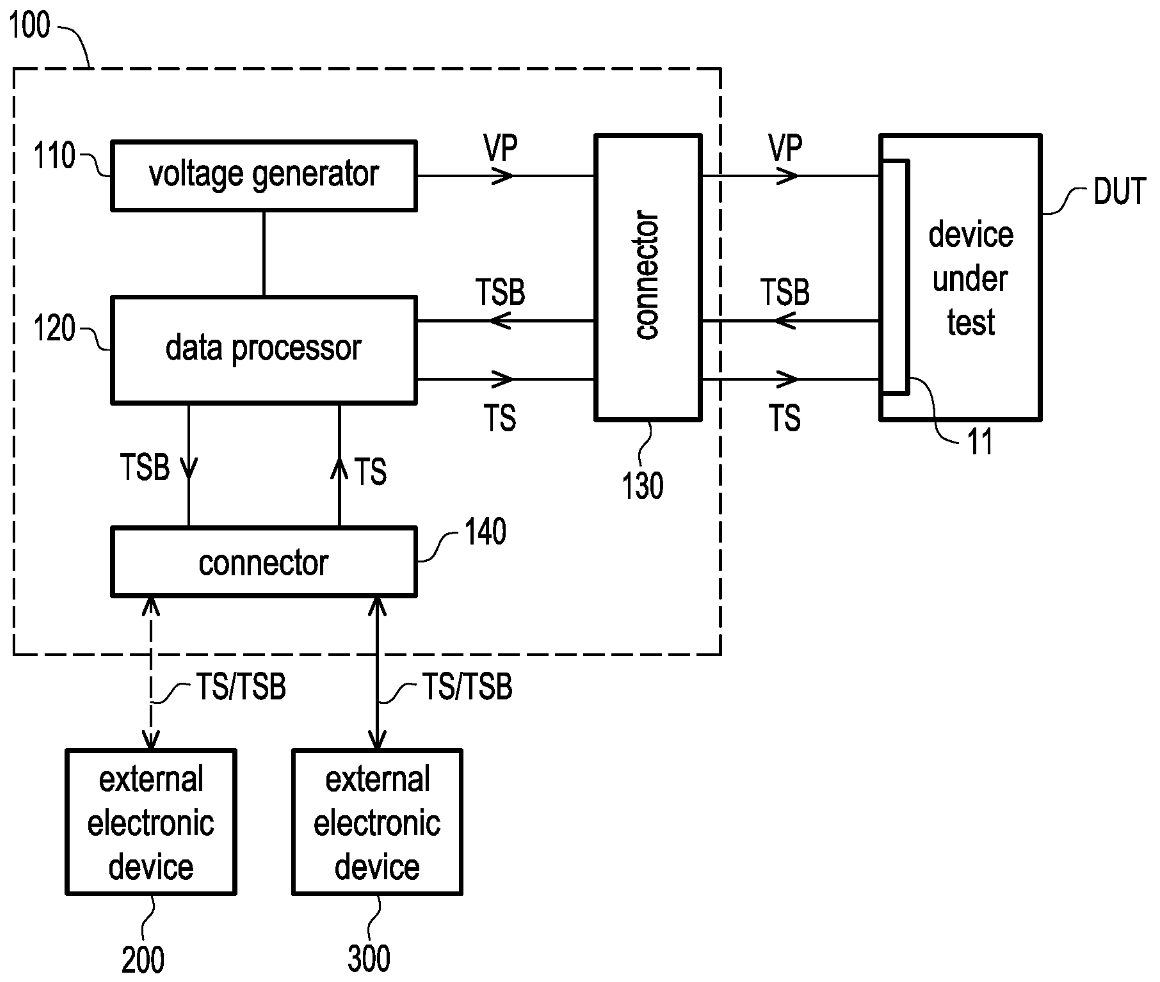
FIG. 1 is a schematic diagram of a test control device according to an embodiment of the disclosure.

FIG. 1 is a schematic diagram of a test control device 100 according to an embodiment of the disclosure. Referring to FIG. 1, the test control device 100 includes a voltage generator 110, a data processor 120, a connector 130, and a connector 140. The data processor 120 is coupled to the voltage generator 110, the connector 130, and the connector 140.

In this embodiment, the connector 130 of the test control device 100 may be connected to a connector 11 of a device under test DUT through a cable. When the device under test DUT is electrically connected to the test control device 100, the test control device 100 may supply power to the device under test DUT and transmit data with the device under test DUT.

According to application requirements, in this embodiment, the connector 130 of the test control device 100 and the connector 11 of the device under test DUT may be Universal Serial Bus (USB) connectors. For example, the connector 130 of the test control device 100 and the connector 11 of the device under test DUT may include a USB type-C connector. In other embodiments, the connector 130 of the test control device 100 and the connector 11 of the device under test DUT may include other electrical connectors.

On the other hand, in this embodiment, the connector 140 of the test control device 100 can be connected to an external electronic device 200 in a first data transmission mode. In addition, the connector 140 of the test control device 100 may be connected to an external electronic device 300 in a second data transmission mode. The first data transmission mode may be a wireless data transmission method, and the second data transmission mode may be a wired data transmission method.

For example, the connector 140 of the test control device 100 may communicate with the external electronic device 200 in a wireless transmission or connection manner through a Bluetooth communication protocol, and may transmit relevant data with the external electronic device 200 in a wireless transmission or connection manner. In addition, the connector 140 of the test control device 100 may be connected to the external electronic device 300 through a cable, and transmit relevant data with the external electronic device 300 in a wired transmission or connection manner.

The external electronic device 200 in this embodiment may be, for example, a smartphone, a tablet computer, or/and a personal digital assistant (PDA), but is not limited thereto. The external electronic device 300 in this embodiment may be, for example, a laptop computer or/and a desktop computer, but is not limited thereto.

Specifically, in this embodiment, the test control device 100 may generate a supply voltage VP to the device under test DUT according to a voltage requirement of the device under test DUT. Furthermore, when the device under test DUT is electrically connected to the test control device 100, the test control device 100 may follow a USB specification to detect whether the device under test DUT has a charging mode supporting a USB-compliant Power Delivery (PD) protocol.

When the test control device 100 detects that the device under test DUT has a charging mode supporting the PD protocol, the test control device 100 may perform a PD negotiation with the device under test DUT through the connector 130 to obtain the voltage requirement of the device under test DUT. Then, the test control device 100 may select a candidate voltage as the supply voltage VP from multiple candidate voltages generated by the voltage generator 110 according to the voltage requirement of the device under test DUT. The test control device 100 may provide the supply voltage VP to the device under test DUT through the connector 130 to supply power to the device under test DUT.

In addition, when the test control device 100 detects that the device under test DUT does not have a charging mode supporting the PD protocol, the test control device 100 may enable the voltage generator 110 to generate the supply voltage VP of a fixed voltage value to the device under test DUT according to the voltage requirement of the device under test DUT, so as to supply power to the device under test DUT.

On the other hand, when a user wants to debug or manage working status of the device under test DUT, the user may connect to the connector 140 of the test control device 100 through the external electronic device (i.e., the external electronic device 200 or the external electronic device 300). After establishing a connection (i.e., a wireless or wired connection) between the external electronic device and the test control device 100, the external electronic device may send a test signal TS to the test control device 100, and the data processor 120 may receive the test signal TS through the connector 140. Then, the data processor 120 may forward the test signal TS to the device under test DUT through the connector 130.

After the device under test DUT receives the test signal TS sent by the external electronic device, the device under test DUT may return a test feedback data TSB to the test control device 100 according to the test signal TS. Furthermore, the test control device 100 may transmit the test feedback data TSB to the external electronic device through the data processor 120. In this way, the external electronic device may perform a data debugging operation with the device under test DUT according to the test signal TS and the test feedback data TSB.

For example, in the data debugging operation, the external electronic device connected to the test control device 100 may detect or manage a power-on status of the device under test DUT and contents of data in respective registers, and other relevant working status, according to the test signal TS and the test feedback data TSB.

Figure 2:
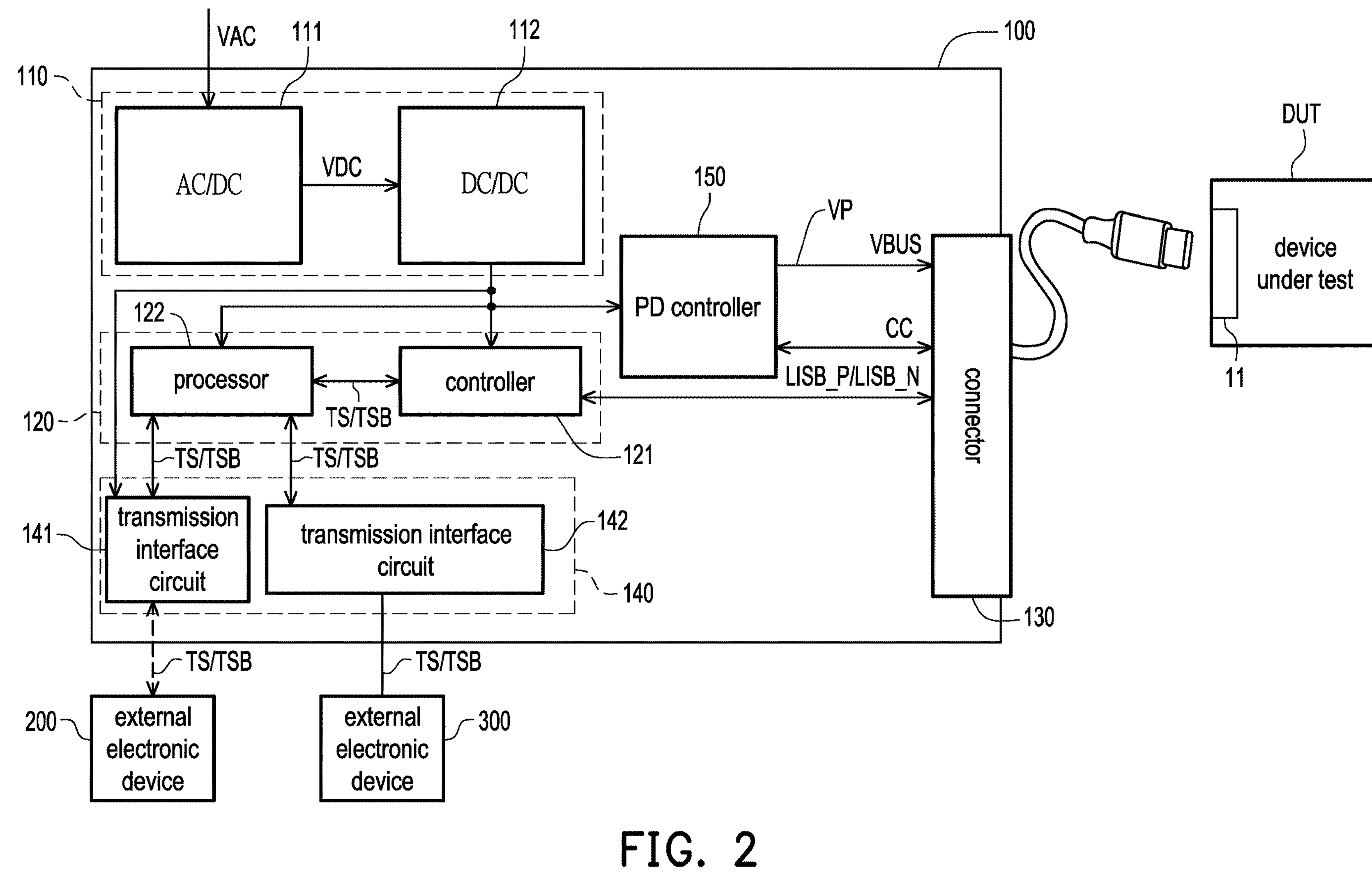
FIG. 2 is a schematic diagram of a test control device according to the embodiment in FIG. 1 of the disclosure in which a device under test has a charging mode supporting a power delivery protocol.

FIG. 2 is a schematic diagram of a test control device 100 according to the embodiment in FIG. 1 of the disclosure in which a device under test DUT has a charging mode supporting a power delivery protocol. Referring to FIG. 1 and FIG. 2 at the same time, in this embodiment, the test control device 100 includes the voltage generator 110, the data processor 120, the connector 130, the connector 140, and a PD controller 150.

Specifically, the voltage generator 110 includes an alternating current (AC)/direct current (DC) converter 111 and a direct current/direct current converter 112. The AC/DC converter 111 is coupled to the DC/DC converter 112, and the DC/DC converter 112 is coupled to the data processor 120, the connector 140, and the PD controller 150.

The data processor 120 includes a controller 121 and a processor 122. The processor 122 may be, for example, a central processing unit (CPU), or other programmable general-purpose or special-purpose microprocessor, digital signal processor (DSP), application specific integrated circuit (ASIC), or other similar components or a combination of the above components, but not limited thereto.

In this embodiment, the controller 121 is coupled to a differential signal pin pair of the connector 130 (e.g., a USB_P pin and a USB_N pin of the connector 130). The test control device 100 may transmit data with the device under test DUT through the differential signal pin pair of the connector 130.

Figure 3:
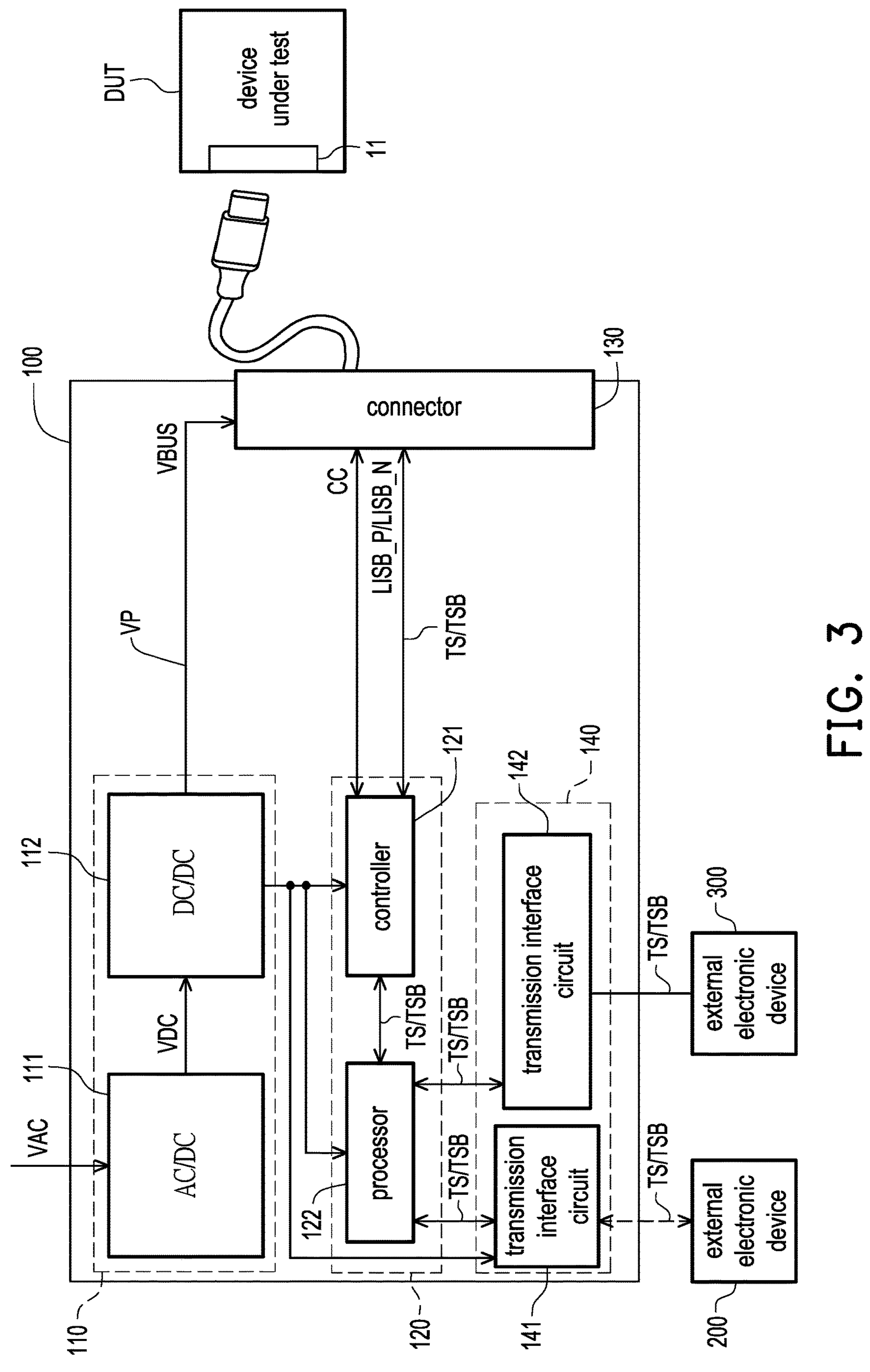
FIG. 3 is a schematic diagram of a test control device according to the embodiment in FIG. 1 of the disclosure in which a device under test does not have a charging mode supporting a power delivery protocol.
Figure 4:
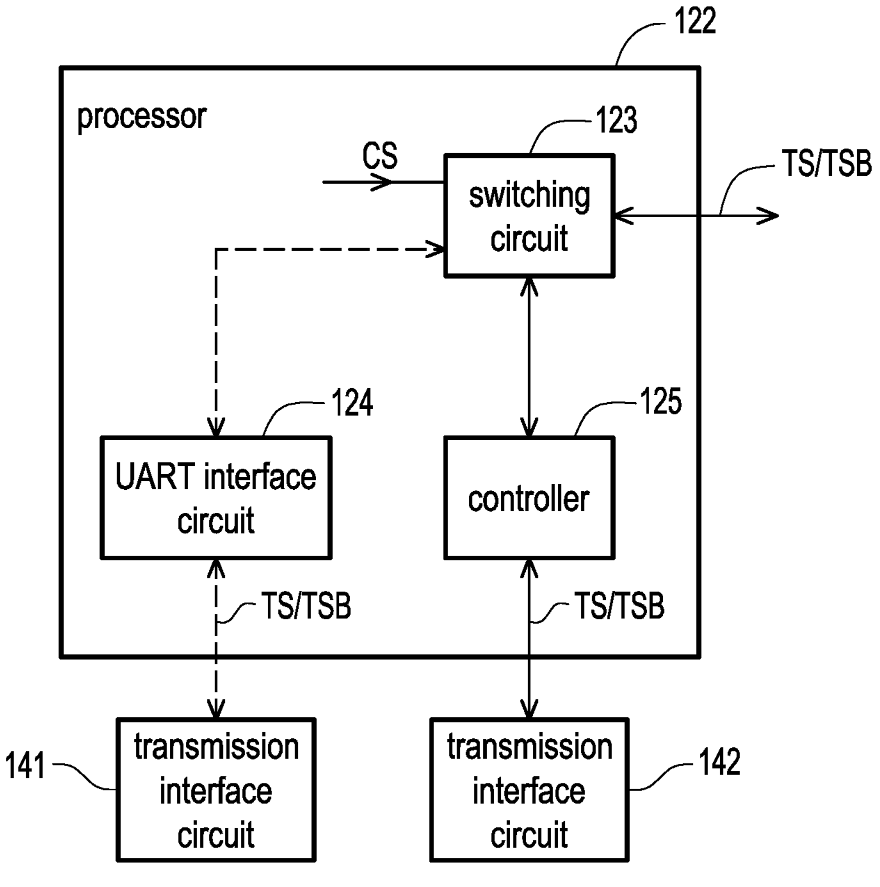
FIG. 4 is a schematic diagram of a data processor according to the embodiments in FIG. 2 and FIG. 3 of the disclosure.

It should be noted that for relevant descriptions of the processor 122 in this embodiment, please refer to FIG. 2 and FIG. 4 at the same time. FIG. 4 is a schematic diagram of a processor 122 of a data processor 120 according to the embodiments in FIG. 2 and FIG. 3 of the disclosure. In this embodiment, the processor 122 includes a switching circuit 123, a Universal Asynchronous Receiver/Transmitter (UART) interface circuit 124, and a controller 125.

The switching circuit 123 may receive a control signal CS. The switching circuit 123 is coupled to the controller 121. The switching circuit 123 may be switched to be coupled to the UART interface circuit 124 or the controller 125 according to the control signal CS. In other words, the switching circuit 123 of the processor 122 may conduct a data transmission path between the controller 121 and the UART interface circuit 124, or conduct a data transmission path between the controller 121 and the controller 125 according to the control signal CS.

In this embodiment, the connector 140 includes a transmission interface circuit 141 and a transmission interface circuit 142. The transmission interface circuit 141 is coupled to the UART interface circuit 124 of the processor 122. The transmission interface circuit 142 is coupled to the controller 125 of the processor 122. The transmission interface circuit 141 of this embodiment may be a wireless transmission interface circuit (e.g., a Bluetooth transmission interface circuit, but not limited thereto), and the transmission interface circuit 142 may be a wired transmission interface circuit.

It should be noted that the transmission interface circuit 141 may be configured to connect to the external electronic device 200 in a wireless data transmission mode (or a wireless connection method), and the transmission interface circuit 142 may be configured to connect to the external electronic device 300 in a wired data transmission mode (or a wired connection method).

In this embodiment, the PD controller 150 is coupled to a power pin VBUS and a configuration channel (CC) pin of the connector 130. The PD controller 150 may detect whether the device under test DUT has a charging mode supporting the PD protocol through the CC pin of the connector 130.

Figure 5:
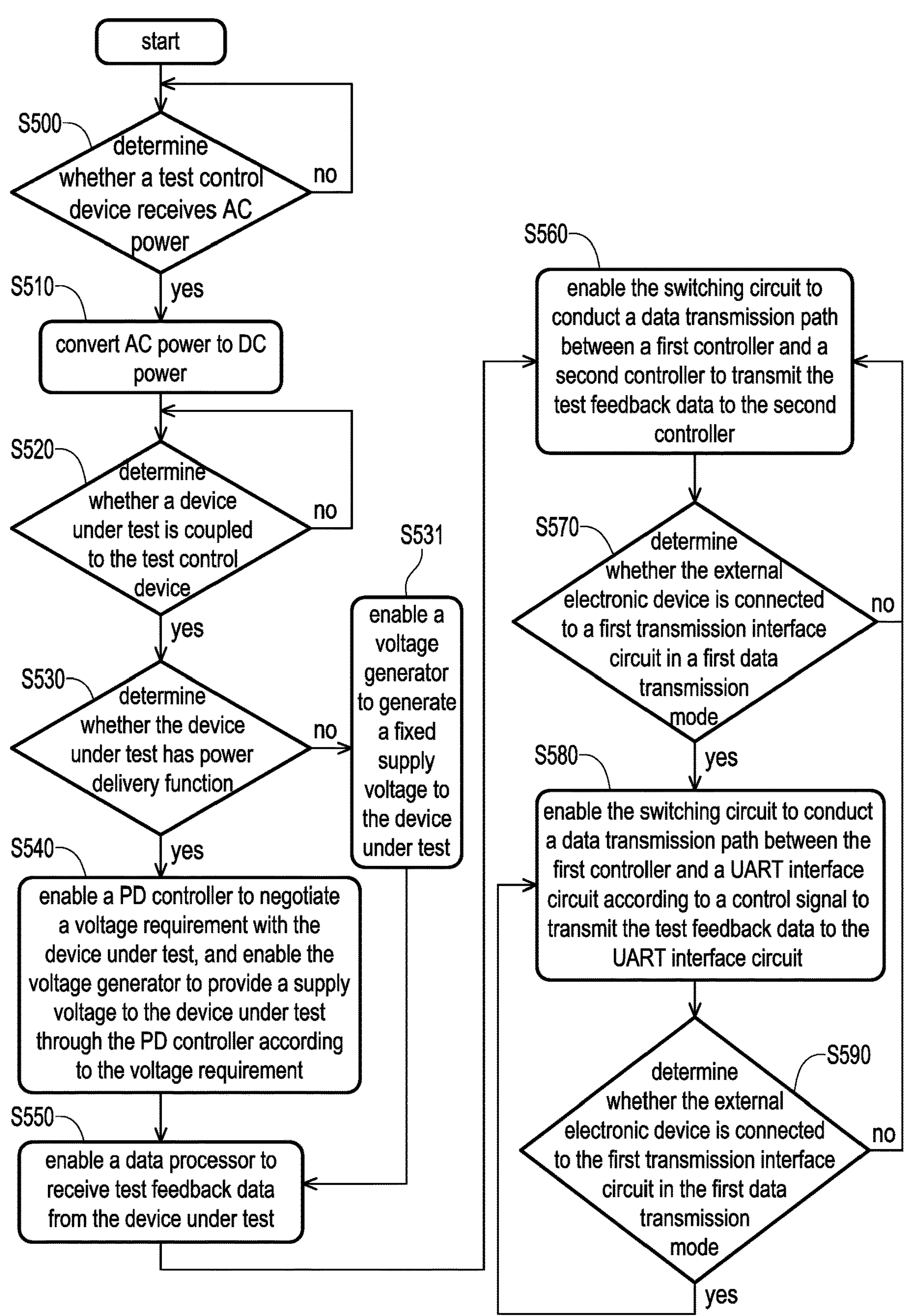
FIG. 5 is an operation flow chart of a processor according to the embodiments in FIG. 1 to FIG. 3 of the disclosure.

Regarding the operation details of the test control device 100, please refer to FIG. 1, FIG. 2, FIG. 4, and FIG. 5 at the same time. FIG. 5 is an operation flow chart of a processor 122 according to the embodiments in FIG. 1 to FIG. 3 of the disclosure. In this embodiment, when the test control device 100 receives AC power VAC (i.e., the determination in step S500 is "yes"), the AC/DC converter 111 of the voltage generator 110 may convert the AC power VAC in step S510 to DC power VDC, and provide the DC power VDC to the DC/DC converter 122. In this case, the DC/DC converter 122 may supply power to various components or circuits in the data processor 120 and the connector 140. In contrast, when the test control device 100 does not receive the AC power VAC (i.e., the determination of step S500 is "no"), the test control device 100 may continue to perform the operation of step S500.

Next, in step S520, the processor 122 may determine whether the device under test DUT is coupled to the test control device 100. When the processor 122 determines that the device under test DUT is not electrically connected to the test control device 100, the processor 122 may continue to perform the operation of step S520. When the processor 122 determines that the device under test DUT has been electrically connected to the test control device 100, the processor 122 may continue to perform the operation of step S530.

Next, in step S530, the processor 122 may determine whether the device under test DUT has a charging mode supporting the PD protocol through the PD controller 150. Furthermore, the PD controller 150 may follow the USB specification and detect whether the device under test DUT has a charging mode supporting the PD protocol through the CC pin of the connector 130. When the PD controller 150 determines that the device under test DUT does not have a charging mode supporting the PD protocol, the processor 122 may continue to perform the operation of step S531. It should be noted that the implementation details of the operation actions of the test control device 100 in step S531 will be described later in the embodiment of FIG. 3.

On the other hand, when the PD controller 150 determines that the device under test DUT has a charging mode supporting the PD protocol, the processor 122 may continue to perform the operation of step S540.

It should be noted that in steps S520 and S530 of this embodiment, the determination mechanism of the processor 122 may be implemented in accordance with a detection method known to those skilled in the art for determining whether the device under test DUT is connected to the test control device 100 and/or a detection method for determining whether the device under test DUT has a charging mode supporting the PD protocol.

Next, if the device under test DUT has a charging mode supporting the PD protocol, in step S540, the processor 122 may enable the PD controller 150 to perform the PD negotiation with the device under test DUT through the CC pin to obtain the voltage requirement of the device under test DUT. In this case, the PD controller 150 may select a candidate voltage as the supply voltage VP from multiple candidate voltages generated by the DC/DC converter 112 of the voltage generator 110 according to the voltage requirement of the device under test DUT. Moreover, the PD controller 150 may provide the supply voltage VP to the device under test DUT through the power pin VBUS of the connector 130 to supply power to the device under test DUT.

It should be noted that for debugging or managing the functions and working status of the device under test DUT, in the following, for example, the user is by default transmitting data with the test control device 100 through the external electronic device 300 in a wired connection method.

For example, when the external electronic device 300 establishes a connection with the transmission interface circuit 142 of the connector 140, the external electronic device 300 may send the test signal TS to the transmission interface circuit 142. Then, the processor 122 may receive the test signal TS from the transmission interface circuit 142 according to the control signal CS, and enables the controller 121 to forward the test signal TS to the device under test DUT through the differential signal pin pair of the connector 130.

In this case, the device under test DUT may generate the test feedback data TSB to the test control device 100 according to the test signal TS. Next, in step S550, the controller 121 of the data processor 120 may receive the test feedback data TSB through the differential signal pin pair of the connector 130.

The controller 121 may transmit the test feedback data TSB generated from the device under test DUT to the processor 122. It should be noted that, in the case where the user is by default transmitting data with the test control device 100 through the external electronic device 300 in a wired connection method, in step S560, the processor 122 of the embodiment may transmit the test feedback data TSB to the transmission interface circuit 142 through the controller 125, so that the external electronic device 300 may perform the data debugging operation with the device under test DUT according to the test signal TS and the test feedback data TSB.

Furthermore, in step S560, the switching circuit 123 of the processor 122 may conduct the data transmission path between the controller 121 and the controller 125 according to the control signal CS, so that the processor 122 may transmit the test feedback data TSB to the external electronic device 300 in a wired transmission manner through the data transmission path between the controller 121 and the controller 125.

Next, in step S570, the processor 122 may further determine whether the external electronic device 200 is connected to the transmission interface circuit 141 in a wireless transmission mode. When the processor 122 does not detect that the external electronic device 200 establishes a connection with the transmission interface circuit 141, the processor 122 may continue to perform the operation of step S560 according to the control signal CS. When the processor 122 detects that the external electronic device 200 establishes a connection with the transmission interface circuit 141, the processor 122 may continue to perform the operation of step S580.

In step S580, when the external electronic device 200 and the transmission interface circuit 141 are connected in the wireless data transmission mode, the external electronic device 200 may resend the test signal TS and transmit the test signal TS to the device under test DUT through the test control device 100. At this time, the device under test DUT may generate the test feedback data TSB to the controller 121 of the test control device 100 according to the test signal TS sent by the external electronic device 200.

Then, the switching circuit 123 may conduct the data transmission path between the controller 121 and the UART interface circuit 124 according to the control signal CS, so that the processor 122 can transmit the test feedback data TSB to the external electronic device 200 in wireless transmission method through the data transmission path between the controller 121 and the UART interface circuit 124. In this way, the external electronic device 200 may perform the data debugging operation with the device under test DUT according to the test signal TS and the test feedback data TSB.

Next, in step S590, the processor 122 may continuously detect whether the external electronic device 200 is connected to the transmission interface circuit 140 in the wireless data transmission mode. When the processor 122 determines that the external electronic device 200 still establishes a connection with the transmission interface circuit 140, the processor 122 may continue to perform the operation of step S580 according to the control signal CS. When the processor 122 determines that the external electronic device 200 has not established a connection with the transmission interface circuit 140, the processor 122 may return to the operation of step S560 according to the control signal CS.

It should be noted that during the process from step S550 to step S590, the processor 122 may perform data format conversion on the data or signals transmitted in the data processor 120 according to relevant software protocols well known to those skilled in the art to conform to the transmission protocols between the various interface circuits.

FIG. 3 is a schematic diagram of a test control device 100 according to the embodiment in FIG. 1 of the disclosure in which a device under test DUT does not have a charging mode supporting a power delivery protocol. Referring to FIG. 1, FIG. 2, FIG. 3, and FIG. 5 at the same time, the circuit configuration of the test control device 100 shown in FIG. 3 is roughly the same or similar to the test control device 100 shown in FIG. 2.

What is different from the embodiment of FIG. 2 is that in step S531, since the test control device 100 detects that the device under test DUT does not have a charging mode supporting the PD protocol, the test control device 100 of the embodiment of FIG. 3 may enable the DC/DC converter 112 of the voltage generator 110 to provide the supply voltage VP of a fixed voltage value to the device under test DUT through the power supply pin VBUS of the connector 130 according to the voltage requirement of the device under test DUT, so as to supply power to the device under test DUT.

The implementation method of the embodiment of FIG. 3 for debugging or managing the functions and working status of the device under test DUT can be deduced based on the relevant descriptions of FIG. 1, FIG. 2, FIG. 4, and FIG. 5, and therefore will not be repeated in the following.

According to the description of the above embodiment, it can be known that in addition to supplying power to the device under test DUT through the cable, the test control device 100 of the embodiment may also be connected to the external electronic device through wireless or wired connections, so that the external electronic device is able to debug or manage functions and working status of the device under test DUT through the test control device 100, so as to enhance convenience and improve operation quality.

Figure 6:
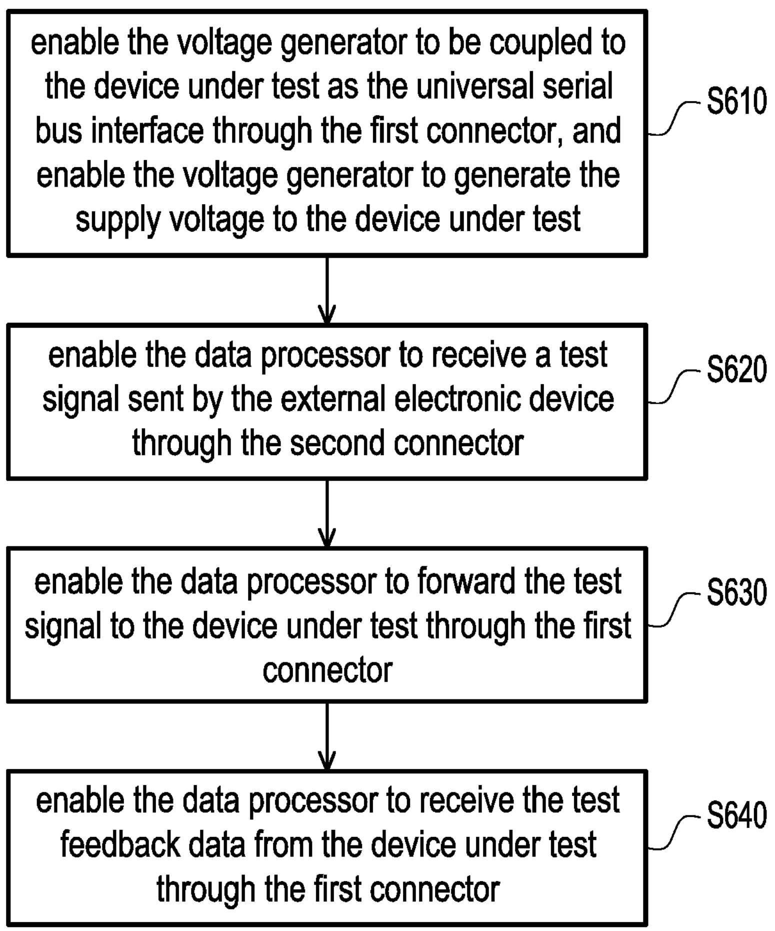
FIG. 6 is a flow chart of an operating method of a test control device according to an embodiment of the disclosure.

FIG. 6 is a flow chart of an operating method of a test control device 100 according to an embodiment of the disclosure. Referring to FIG. 1 and FIG. 6 at the same time, in step S610, the test control device may enable the voltage generator to be coupled to the device under test as the universal serial bus interface through the first connector, and enable the voltage generator to generate the supply voltage to the device under test. In step S620, the test control device may enable the data processor to receive the test signal sent by the external electronic device through the second connector.

In step S630, the test control device may enable the data processor to forward the test signal to the device under test through the first connector. In step S640, the test control device may enable the data processor to receive the test feedback data from the device under test through the first connector. The implementation details of each step are described in detail in the foregoing embodiments and implementation methods, and therefore will not be repeated in the following.

In summary, in addition to supplying power to the device under test through the cable, the test control device and the operating method thereof described in embodiments of the disclosure may also be connected to the external electronic device through wireless or wired connections, so that the external electronic device is able to debug or manage functions and working status of the device under test through the test control device, so as to enhance convenience and improve operation quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A test control device, comprising:

a voltage generator coupled to a device under test as a Universal Serial Bus (USB) interface through a first connector, the voltage generator configured to generate a supply voltage to the device under test;

a data processor coupled to the first connector and a second connector, wherein the data processor receives a test signal sent by an external electronic device through the second connector, the data processor forwards the test signal to the device under test through the first connector, and the data processor receives a test feedback data from the device under test through the first connector; and a power delivery (PD) controller coupled to the voltage generator and a configuration channel (CC) pin of the first connector, configured to detect whether the device under test has a charging mode supporting a PD protocol through the CC pin of the first connector, wherein when the PD controller detects that the device under test has the charging mode supporting the PD protocol, the voltage generator selects a candidate voltage from a plurality of candidate voltages as the supply voltage through the PD controller, and provides the supply voltage to the device under test.

2. The test control device according to claim 1, wherein the data processor comprises:

a first controller coupled to a differential signal pin pair of the first connector; and a processor coupled to the first controller and the second connector, wherein the processor receives the test signal sent by the external electronic device through the second connector according to a control signal, and enables the first controller to forward the test signal to the device under test through the differential signal pin pair of the first connector, and the first controller receives the test feedback data from the device under test through the differential signal pin pair of the first connector, and enables the processor to transmit the test feedback data to the external electronic device according to the control signal.

3. The test control device according to claim 2, wherein the processor comprises:

a switching circuit coupled to the first controller to receive the control signal;

a Universal Asynchronous Receiver/Transmitter (UART) interface circuit coupled between the switching circuit and the second connector; and a second controller coupled between the switching circuit and the second connector, wherein the switching circuit conducts a data transmission path between the first controller and the UART interface circuit or conducts a data transmission path between the first controller and the second controller according to the control signal.

4. The test control device according to claim 3, wherein the second connector comprises:

a first transmission interface circuit coupled to the UART interface circuit to connect to the external electronic device in a first data transmission mode; and a second transmission interface circuit coupled to the second controller to connect to the external electronic device in a second data transmission mode.

5. The test control device according to claim 4, wherein when the control signal indicates that the external electronic device is not connected to the first transmission interface circuit in the first data transmission mode, the switching circuit of the processor conducts the data transmission path between the first controller and the second controller according to the control signal, and enables the external electronic device to connect to the second transmission interface circuit in the second data transmission mode, and the external electronic device performs a data debugging operation with the device under test according to the test signal and the test feedback data.

6. The test control device according to claim 5, wherein when the control signal indicates that the external electronic device is connected to the first transmission interface circuit in the first data transmission mode, the switching circuit of the processor conducts the data transmission path between the first controller and the UART interface circuit according to the control signal, and enables the external electronic device to connect to the first transmission interface circuit in the first data transmission mode, and the external electronic device performs the data debugging operation with the device under test according to the test signal and the test feedback data.

7. The test control device according to claim 4, wherein the first transmission interface circuit is a wireless transmission interface circuit, and the second transmission interface circuit is a wired transmission interface circuit.

8. The test control device according to claim 4, wherein the first data transmission mode is a wireless data transmission method, and the second data transmission mode is a wired data transmission method.

9. An operating method of a test control device, comprising:

enabling a voltage generator to be coupled to a device under test as a Universal Serial Bus (USB) interface through a first connector, and enabling the voltage generator to generate a supply voltage to the device under test;

enabling a data processor to receive a test signal sent by an external electronic device through a second connector;

enabling the data processor to forward the test signal to the device under test through the first connector;

enabling the data processor to receive a test feedback data from the device under test through the first connector;

providing a power delivery (PD) controller, and enabling the PD controller to detect whether the device under test has a charging mode supporting a PD protocol through a configuration channel (CC) pin of the first connector; and when the PD controller detects that the device under test has the charging mode supporting the PD protocol, enabling the voltage generator to select a candidate voltage from a plurality of candidate voltages as the supply voltage through the PD controller, and enabling the PD controller to provide the supply voltage to the device under test.

10. The operating method according to claim 9, comprising:

providing a processor of the data processor, and enabling the processor to receive the test signal sent by the external electronic device through the second connector according to a control signal;

providing a first controller of the data processor, and enabling the first controller to forward the test signal to the device under test through a differential signal pin pair of the first connector;

enabling the first controller to receive the test feedback data from the device under test through the differential signal pin pair of the first connector; and enabling the processor to transmit the test feedback data to the external electronic device according to the control signal.

11. The operating method according to claim 10, comprising:

providing a switching circuit of the processor, a Universal Asynchronous Receiver/Transmitter (UART) interface circuit, and a second controller; and enabling the switching circuit to receive the control signal, and enabling the switching circuit to conduct a data transmission path between the first controller and the UART interface circuit or conduct a data transmission path between the first controller and the second controller according to the control signal.

12. The operating method according to claim 11, comprising:

providing a first transmission interface circuit of the second connector, and enabling the first transmission interface circuit to connect to the external electronic device in a first data transmission mode; and providing a second transmission interface circuit of the second connector, and enabling the second transmission interface circuit to connect to the external electronic device in a second data transmission mode.

13. The operating method according to claim 12, comprising:

when the control signal indicates that the external electronic device is not connected to the first transmission interface circuit in the first data transmission mode, enabling the switching circuit of the processor to conduct the data transmission path between the first controller and the second controller according to the control signal, and enabling the external electronic device to connect to the second transmission interface circuit in the second data transmission mode, and enabling the external electronic device to perform a data debugging operation with the device under test according to the test signal and the test feedback data.

14. The operating method according to claim 13, comprising:

when the control signal indicates that the external electronic device is connected to the first transmission interface circuit in the first data transmission mode, enabling the switching circuit of the processor to conduct the data transmission path between the first controller and the UART interface circuit according to the control signal, and enabling the external electronic device to connect to the first transmission interface circuit in the first data transmission mode, and enabling the external electronic device to perform the data debugging operation with the device under test according to the test signal and the test feedback data.

15. The operating method according to claim 12, wherein the first transmission interface circuit is a wireless transmission interface circuit, and the second transmission interface circuit is a wired transmission interface circuit.

16. The operating method according to claim 12, wherein the first data transmission mode is a wireless data transmission method, and the second data transmission mode is a wired data transmission method.

* * * * *